United States Patent
Goulakov et al.

(10) Patent No.: US 9,489,967 B2
(45) Date of Patent: Nov. 8, 2016

(54) METHOD AND APPARATUS FOR ALIGNING A LASER DIODE ON A SLIDER

(71) Applicant: Seagate Technology LLC, Cupertino, CA (US)

(72) Inventors: Arkadi Goulakov, Fremont, CA (US); Thomas Roy Boonstra, Chaska, MN (US); Jon Paul Hurley, Bloomington, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/746,080

(22) Filed: Jun. 22, 2015

(65) Prior Publication Data

US 2015/0287424 A1    Oct. 8, 2015

Related U.S. Application Data

(62) Division of application No. 13/097,710, filed on Apr. 29, 2011, now Pat. No. 9,065,236.

(60) Provisional application No. 61/330,067, filed on Apr. 30, 2010.

(51) Int. Cl.
   *G02B 6/42* (2006.01)
   *G11B 5/105* (2006.01)
   *G11B 5/31* (2006.01)
   *G11B 5/00* (2006.01)
   *H01S 5/022* (2006.01)
   *H01S 5/00* (2006.01)

(52) U.S. Cl.
   CPC ............ *G11B 5/105* (2013.01); *G02B 6/4228* (2013.01); *G11B 5/3173* (2013.01); *H01S 5/02252* (2013.01); *G11B 2005/0021* (2013.01); *H01S 5/005* (2013.01); *Y10T 29/49826* (2015.01)

(58) Field of Classification Search
   None
   See application file for complete search history.

(56) References Cited

U.S. PATENT DOCUMENTS

| | | | |
|---|---|---|---|
| 4,079,404 A | 3/1978 | Comerford et al. | |
| 5,023,881 A | 6/1991 | Ackerman et al. | |
| 5,249,733 A * | 10/1993 | Brady | B23K 1/0016 228/180.22 |
| 5,357,536 A | 10/1994 | Andrews | |
| 5,379,359 A | 1/1995 | Gupta | |
| 5,488,678 A | 1/1996 | Taneya et al. | |
| 5,604,831 A * | 2/1997 | Dittman | B23K 1/0056 219/121.63 |
| 5,700,987 A * | 12/1997 | Basavanhally | G02B 6/4225 219/209 |
| 5,835,518 A | 11/1998 | Mundinger et al. | |

(Continued)

FOREIGN PATENT DOCUMENTS

CN    1599159    3/2005

OTHER PUBLICATIONS

File History from U.S. Appl. No. 13/097,710.

(Continued)

*Primary Examiner* — Tina Wong
*Assistant Examiner* — John M Bedtelyon
(74) *Attorney, Agent, or Firm* — Hollingsworth Davis, LLC

(57) ABSTRACT

A structure includes a channel waveguide and a pocket adjacent to an input facet of the channel waveguide. A laser having an output facet is positioned in the pocket. The structure includes a stop on either the laser or a wall of the pocket. The stop is positioned at an interface between the laser and the wall of the pocket such that the output facet of the laser and the input facet of the waveguide are separated by a gap.

17 Claims, 7 Drawing Sheets

(56) References Cited

U.S. PATENT DOCUMENTS

| | | | |
|---|---|---|---|
| 6,762,119 B2* | 7/2004 | Ray | H01S 5/02272 385/14 |
| 7,308,167 B2 | 12/2007 | Trott et al. | |
| 7,358,109 B2 | 4/2008 | Gallup et al. | |
| 7,538,978 B2 | 5/2009 | Sato et al. | |
| 7,821,880 B2 | 10/2010 | Tanaka et al. | |
| 7,955,099 B2 | 6/2011 | Tan | |
| 8,023,226 B2 | 9/2011 | Shimazawa et al. | |
| 8,184,507 B1 | 5/2012 | Hirano et al. | |
| 8,345,517 B2 | 1/2013 | Hurley et al. | |
| 9,066,457 B2* | 6/2015 | Sasaki | H01L 25/0657 |
| 2002/0034834 A1 | 3/2002 | Verdiell | |
| 2002/0041725 A1 | 4/2002 | Carroll | |
| 2002/0196997 A1 | 12/2002 | Chakravorty et al. | |
| 2006/0186538 A1* | 8/2006 | Suzuka | H05K 3/341 257/737 |
| 2006/0187564 A1 | 8/2006 | Sato et al. | |
| 2009/0052077 A1 | 2/2009 | Tanaka et al. | |
| 2009/0059411 A1 | 3/2009 | Tanaka et al. | |
| 2011/0266469 A1 | 11/2011 | Goulakov et al. | |
| 2015/0072473 A1* | 3/2015 | Lam | B23K 1/0016 438/106 |

OTHER PUBLICATIONS

File History from U.S. Appl. No. 13/097,693.
Office Action dated Feb. 22, 2016 from Chinese Application No. 201210143216.4, 7 pages.

* cited by examiner

METHOD AND APPARATUS FOR ALIGNING A LASER DIODE ON A SLIDER

CROSS REFERENCE TO RELATED APPLICATIONS

This application is a divisional of U.S. application Ser. No. 13/097,710, filed Apr. 29, 2011, which claims the benefit of U.S. Provisional Application Ser. No. 61/330,067, filed Apr. 30, 2010, the content of which is incorporated herein by reference in their entireties.

BACKGROUND

Heat assisted magnetic recording (HAMR) generally refers to the concept of locally heating a recording media to reduce the coercivity of the media so that an applied magnetic writing field can more easily direct the magnetization of the media during the temporary magnetic softening of the media caused by the heat source. A tightly confined, high power laser light spot can be used to heat a portion of the recording media. Then the heated portion is subjected to a magnetic field that sets the direction of magnetization of the heated portion. With HAMR, the coercivity of the media at ambient temperature can be much higher than the coercivity during recording, thereby enabling stability of the recorded bits at much higher storage densities and with much smaller bit cells.

One approach for directing light onto recording media uses a laser diode mounted on a read/write head (also referred to as a "slider"). The laser diode directs light to a planar waveguide that transmits the light to a small spot adjacent to an air bearing surface of the slider. A near-field transducer (NFT) can be included to further concentrate the light. The near-field transducer is designed to reach a local surface plasmon (LSP) condition at a designated light wavelength. At LSP, a high field surrounding the near-field transducer appears, due to collective oscillation of electrons in the metal. Part of the field will tunnel into an adjacent media and get absorbed, raising the temperature of the media locally for recording.

A significant consideration for heat assisted magnetic recording (HAMR) is the location of a laser diode that is used as the optical power source. One current design places a laser diode on the top of a slider. Radiation from the laser diode is focused and directed to coupling grating on the waveguide using external optical elements. This method involves the development of the external optical elements and could be implemented by assembling the sliders one-by-one and using active alignment.

A potential embodiment integrates a laser diode into the trailing edge of the slider and uses a waveguide coupler to guide the laser to the near field transducer using a combination of light-positioning elements such as solid immersion mirrors (SIMs) an/or channel waveguides. Proper alignment between the laser diode and the waveguide is needed to achieve the desired coupling of light from the laser to the waveguide. In addition, this needs to be accomplished in a cost-effective manner.

SUMMARY

In one aspect, an apparatus includes: a structure including a channel waveguide and a pocket adjacent to an input facet of the channel waveguide; a laser having an output facet and being positioned in the pocket; and a stop on at least one of the laser and a wall of the pocket; wherein the stop is positioned at an interface between the laser and the wall of the pocket such that the output facet of the laser and the input facet of the waveguide are separated by a gap.

In another aspect, a method involves: providing a structure including a channel waveguide and a pocket adjacent to an input facet of the channel waveguide; positioning a laser having an output facet in the pocket; forcing the laser toward a wall of the pocket until an axial stop on at least one of the laser and the wall of the pocket is positioned at an interface between the laser and the wall of the pocket such that the output facet of the laser and the input facet of the waveguide are separated by a gap; and fixing the relative position of the laser and the channel waveguide.

In another aspect, a method involves: positioning a carrier wafer relative to a head wafer such that each of a plurality of laser diodes of the carrier wafer is aligned with an alignment feature of a corresponding one of a plurality of slider portions of the head wafer; injecting a gas between the carrier wafer and the head wafer via openings in at least one the carrier wafer and the head wafer to create preferential surface conditions on solder surfaces therebetween; and performing a reflow operation to bond the laser diodes to the corresponding slider portions, wherein the reflow operation further causes a final alignment therebetween in cooperation with the alignment features of the slider portions.

DETAILED DESCRIPTION

Figure 1:
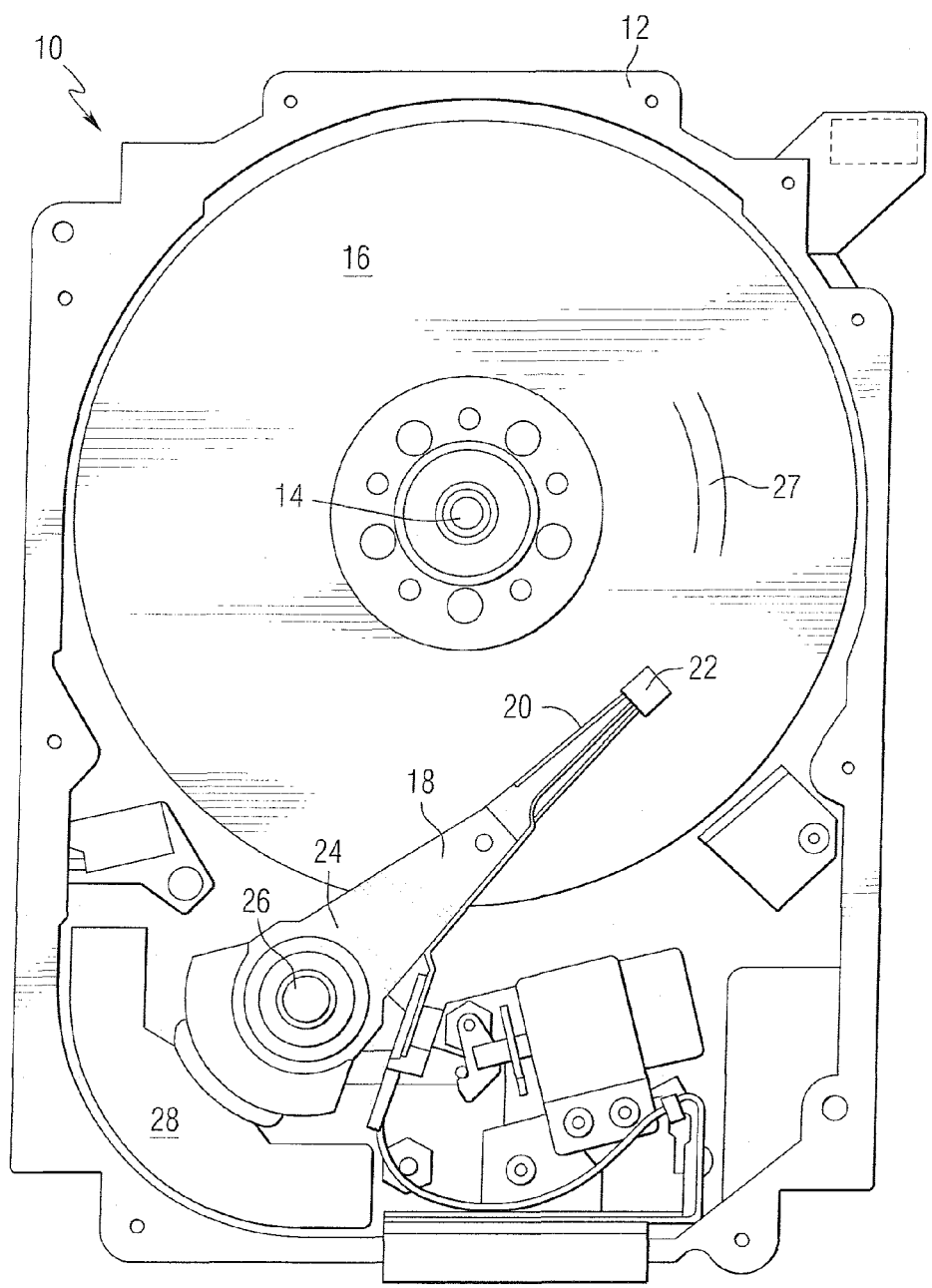
FIG. 1 is a pictorial representation of a data storage device in the form of a disc drive that can include a slider in accordance with an embodiment.

FIG. 1 is a pictorial representation of a data storage device in the form of a disc drive 10 that can include a slider constructed in accordance with an embodiment. The disc drive 10 includes a housing 12 (with the upper portion removed and the lower portion visible in this view) sized and configured to contain the various components of the disc drive. The disc drive 10 includes a spindle motor 14 for rotating at least one magnetic storage media 16 within the housing. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired track 27 of the disc 16. The actuator motor 28 is regulated by a controller, which is not shown in this view and is well-known in the art.

For heat assisted magnetic recording (HAMR), electromagnetic radiation, for example, visible, infrared or ultraviolet light is directed onto a surface of the recording media to raise the temperature of a localized area of the media to facilitate switching of the magnetization of the heated area. Recent designs of HAMR recording heads include a thin film waveguide on a slider to guide light to the recording media for localized heating of the recording media. A near-field transducer positioned at the air bearing surface of a recording head can be used to direct the electromagnetic radiation to a small spot on the recording media.

In a HAMR storage device constructed according to one embodiment, a laser diode chip is positioned on the slider. Precise alignment of the laser diode output and the waveguide is achieved by using laser diode beds (also referred to as cavities or pockets) with specially designed features, such as stoppers and steps.

Figure 2:
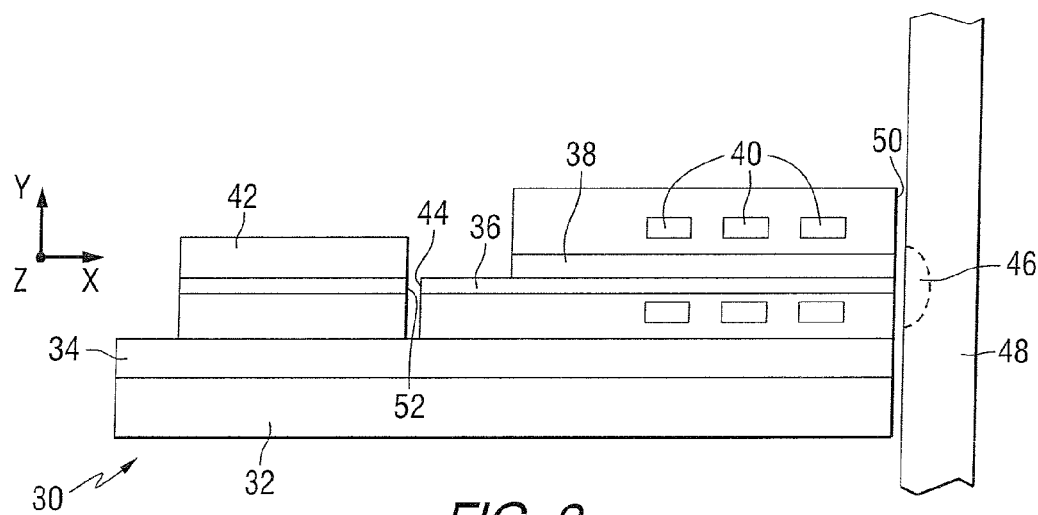
FIG. 2 is a cross-sectional view of a laser diode and a portion of a slider.

FIG. 2 is a cross-sectional view of an example of a slider for use in heat assisted magnetic recording. The slider 30 includes a substrate 32, a base coat 34 on the substrate, waveguide 36 on the base coat, and a write pole 38 that is positioned adjacent to the waveguide. A coil 40 includes conductors that pass around the write pole. A laser diode 42 is positioned on the slider to direct light onto an input facet 44 of the waveguide. The light then passes through the waveguide and is used to heat a portion 46 of a storage media 48 that is positioned adjacent to an air bearing surface 50 of the slider. The light may be used with a near field transducer to further control the thermal effects. It is desirable to align an output facet 52 of the laser diode with the input facet of the waveguide to achieve efficient coupling of the light from the laser diode to the waveguide. In addition, physical contact between the output facet 52 of the laser diode with the input facet of the waveguide is to be avoided to prevent damage to the facets that might occur from such contact.

In one aspect, a method for alignment of the laser diode and the waveguide on the slider for Heat Assisted Magnetic Recording (HAMR). The slider includes geometrical features for passive alignment of a laser diode and the channel waveguide when the laser diode is placed on the slider.

Figure 3:
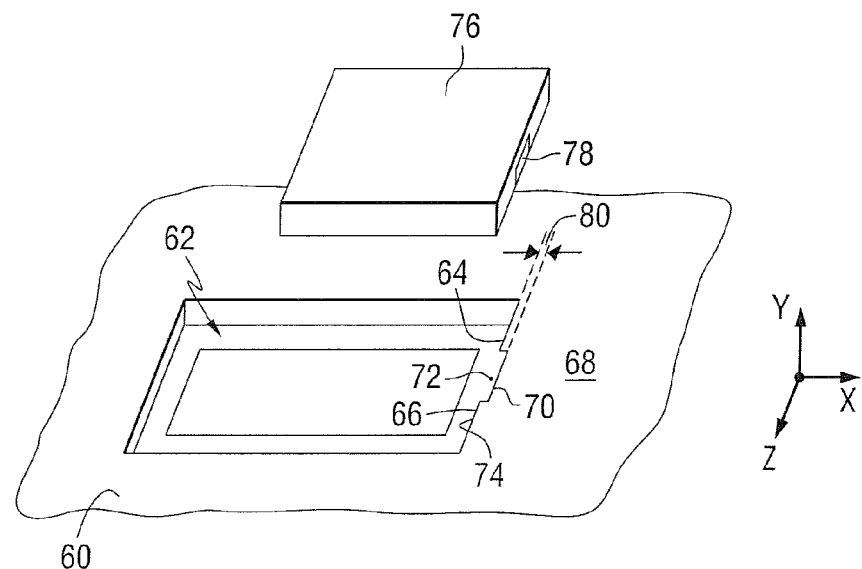
FIG. 3 is an isometric view of a laser diode and a portion of a slider.

FIG. 3 shows an example of a portion of a slider 60 having a pocket 62 (also called a bed or cavity) with front facet stops 64 and 66. The slider includes a planar waveguide portion 68 having an input facet 70 adjacent to the pocket. The input facet is in a recess 72 in a wall 74 of the pocket, with stops 64 and 66 on opposite sides of the recess. A laser diode 76, which can be in the form of a laser chip, includes an output facet 78 from which the laser emits electromagnetic radiation, for example, visible, infrared or ultraviolet light. The laser diode can be positioned in the pocket and moved toward the waveguide until it abuts the stops 64 and 66. The stops prevent contact between the laser output facet and the waveguide input facet.

For the apparatus of FIG. 3, the alignment is achieved between the output facet of the laser and the input facet of the waveguide by placing a laser diode in the pocket and pushing the laser diode forward to the stops. The input facet on the waveguide side can be formed by a vertical etch process and can be wider than the active output area (i.e., the output facet) of the laser diode. This design allows precise control of the distance between the output facet of the laser diode and the input facet of the waveguide. The distance 80 between the output facet of the laser diode and the input facet of the waveguide is defined by depth of the recess in the wall of the pocket. Thus the active area of the laser diode is not in mechanical contact with the waveguide, and remains undamaged.

Figure 4:
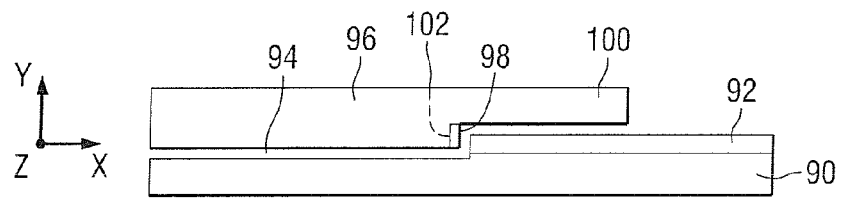
FIG. 4 is a cross-sectional view of a laser diode and a portion of a slider.

The relative position between the laser output facet and the waveguide input facet in the lateral direction (i.e., the X direction) can be controlled with an etched step in a wall of the pocket and one or more stops on the laser diode. This is shown in an embodiment illustrated in FIG. 4, wherein a portion of a slider 90 includes a waveguide 92 and a pocket 94. In this example, the laser diode 96 includes one or more stops 98 and an overhanging portion 100. The stops on the laser diode side could be projections positioned on opposite sides of the laser output facet 102. Alternatively, the stops could be portions of a side of the laser diode, with the output facet being recessed in the side. With this structure, the distance between stops on the laser diode and the output facet could be defined by a photolithography process. Thus the geometrical distance control is the same as the precision of the photolithography process, which could be below 50 nm.

Figure 5:
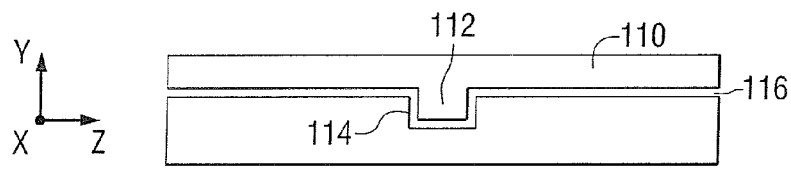
FIG. 5 is a cross-sectional view of a laser diode and a portion of a slider.

A structure that provides for lateral alignment (i.e., in the Z-direction) is shown in FIG. 5. The structure includes one or more etched grooves in the base of the pocket and a mesa structure on the laser chip. In the embodiment of FIG. 5, a laser diode 110 includes a longitudinally extending mesa or projection 112 that fits within a groove 114 in the base or bottom of the pocket 116. The mesa could be used to define optical and current confinement for a single mode laser diode. In this configuration, the central portion of the protruding mesa contains the active laser quantum well. The outer regions (that are used for mechanical referencing) are etched away down to the base substrate material of the laser.

Figure 6:
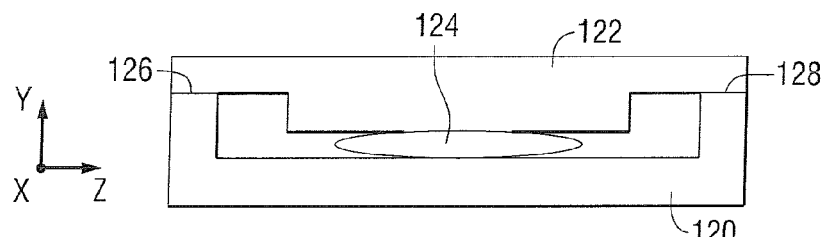
FIG. 6 is a cross-sectional view of a laser diode and a portion of a slider.

FIG. 6 is a schematic representation of a portion of a slider 120 constructed in accordance with another embodiment. In the embodiment of FIG. 6, alignment in the vertical direction (i.e., the Y direction) is controlled during a bonding process, in which the laser diode 122 is mounted in the slider pocket by a bonding compound 124. The slider includes etched stops 126 and 128 to provide vertical distance control without precise control of bonding compound thickness. One way to get a repeatable vertical position of the laser diode chip is to hold it down during the bonding process. Another approach to holding the laser chip is to use the bonding compound surface tension during bonding. This approach can be considered to be a two-step process. The first step is to place the laser diode chip in the pocket with rough tolerance of 2-5 microns. In the second step, surface tension force could be used to precisely align the laser diode and channel waveguide as a result of a reflow process using the bonding compound.

Figure 7:
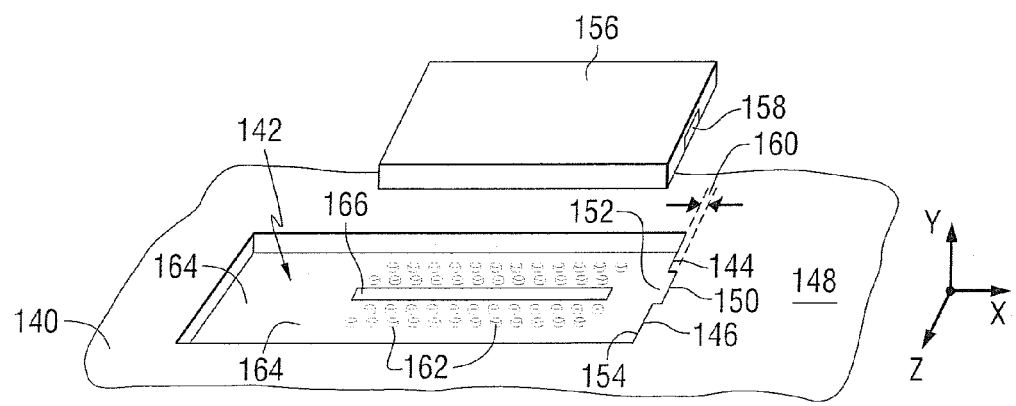
FIG. 7 is an isometric view of a portion of the pocket in the slider.

FIG. 7 shows an example of a portion of a slider 140 having a pocket 142 with stops 144 and 146. The slider includes a planar waveguide portion 148 having an input facet 150 adjacent to the pocket. The input facet is in a recess 152 in a wall 154 of the pocket, with stops 144 and 146 on opposite sides of the recess. A laser diode 156, which can be in the form of a laser chip, includes an output facet 158 from which the laser emits electromagnetic radiation, for example, visible, infrared or ultraviolet light. The laser diode can be positioned in the pocket and moved toward the waveguide until it abuts the stops 144 and 146. The stops prevent contact between the laser output facet and the waveguide input facet.

For the example of FIG. 7, the alignment is achieved between the output facet of the laser and the input facet of the waveguide by placing a laser diode in the pocket and pushing the laser diode forward to the stoppers. The input facet on the waveguide side can be formed by a vertical etch process and can be wider than the active output area (i.e., the output facet) of the laser diode. This design allows precise control of the distance between the output facet of the laser diode and the input facet of the waveguide. More specifically, the distance 160 between the output facet of the laser diode and the input facet of the waveguide is defined by depth of the recess in the wall of the pocket. Thus the active area of the laser diode is not in mechanical contact with the waveguide, and remains undamaged.

A plurality of solder bumps 162 are positioned on the bottom 164 of the pocket 142. A laser diode contact pad 164 is also positioned on the bottom of the pocket and could have shape presented in FIG. 7. The contact pad 166 on the bottom of the pocket serves as a heat sink. The final laser diode chip position will depend on the location of wetting regions, the amount of bonding compound (eutectic) material between the bottom of the pocket and the laser diode, and the stop design. The structure of FIG. 7 can be used in flip chip bonding methods. Examples of the bonding compound include solder and epoxy.

Figure 8:
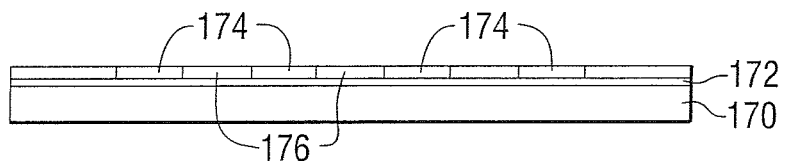
FIG. 8 is a cross-sectional view of a portion of the pocket in the slider, including bonding pads.

FIGS. 8-12 illustrate how the bonding process can be used to force the laser diode toward the stops. FIG. 8 shows a cross-sectional view of a portion of the bottom of a pocket in a slider 170. A seed layer 172 is positioned on the bottom of the pocket. A plurality of contact pads 174 are positioned on the openings in insulator 174 above the seed layer. The contact pads are formed of a wettable "under bump metallurgy" (UBM) material (e.g., Au, Cu, Ni, Cr, Ti, TiW) that will allow the formation of a good solder bump. An insulating material 176 is positioned between the contact pads. Contact pads may be used just for positioning or also for electrical contact.

Figure 9:
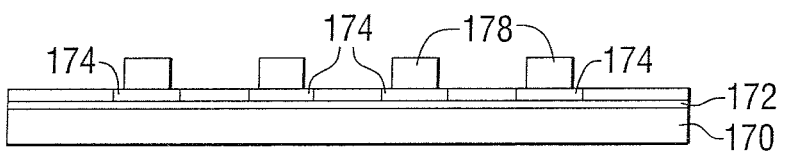
FIG. 9 is a cross-sectional view of a portion of the pocket in a slider, including bonding bumps.

FIG. 9 shows a cross-sectional view of the structure of FIG. 8, with the addition of a plurality of bonding compound (e.g., eutectic material) bumps 178 on the contact pads 174.

Figure 10:
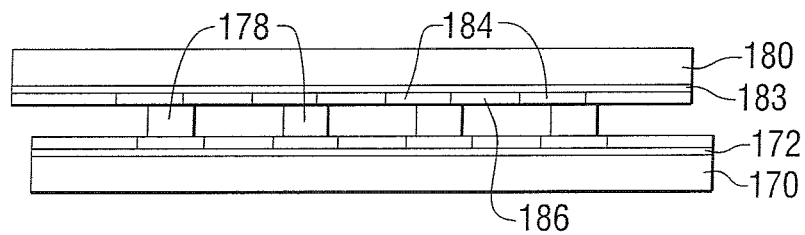
FIG. 10 is a cross-sectional view of a laser diode and a portion of a slider.

FIG. 10 shows a cross-sectional view of the structure of FIG. 9, with the addition of a laser diode 180 having a seed layer 182 on a bottom surface, and a plurality of contact pads 184 positioned on the seed layer. An insulating material 186 is positioned between the contact pads. The position of the contact pads on the laser diode is inherently offset with respect to the contact pads in the pocket due to placement tolerances.

Figure 11:
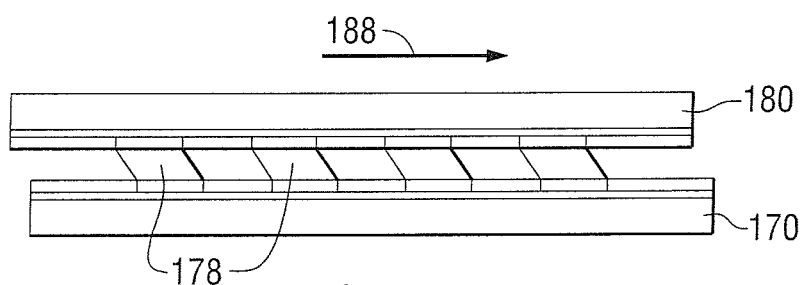
FIG. 11 is a cross-sectional view of a laser diode and a portion of a slider.

FIG. 11 shows self alignment due to a material reflow (e.g., solder reflow), wherein the laser diode is offset with respect to a desired reference surface in the slider and surface tension of the reflowing eutectic material creates a force illustrated by arrow 188.

Figure 12:
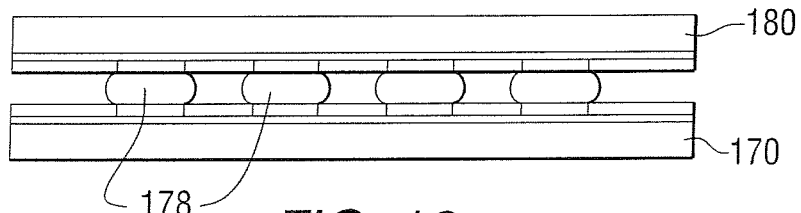
FIG. 12 is a cross-sectional view of a laser diode and a portion of a slider.

FIG. 12 shows a cross-sectional view of the structure of FIG. 11, following solidification of the eutectic material. From FIGS. 8-12, it can be seen that surface tension forces of the bonding compound can be used to align the contact pads on the laser diode with the contact pads in the pocket. By selecting the relative position of the contacts pads on the diode and the pocket, surface tension forces can be used to urge the laser into contact with the stops in FIGS. 3 and 7. In addition, the bumps can be intentionally offset to drive the laser into the mechanical stops before self-alignment equilibrium is reached.

In an embodiment, multiple laser chips can be simultaneously bonded to multiple sliders. Precise alignment of the laser diode output facet and the input facet of the channel waveguide is achieved by using laser diode beds with specially designed features, like stops and steps. Placement of the laser diode is immediately followed by solder reflow in a single tool, so these two process steps described above effectively become one production step. The method is illustrated in FIGS. 13-15.

Figure 13:
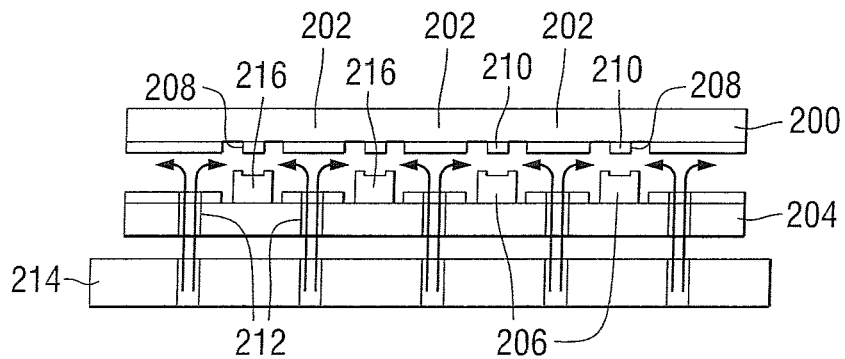
FIG. 13 is a cross-sectional view of a first wafer including a plurality of laser diodes and second wafer including a plurality of sliders.

FIG. 13 is a cross-sectional view of a first wafer 200 (also called a head wafer) including a plurality of slider portions 202 and second wafer 204 (also called a carrier wafer) including a plurality of laser diodes 206. The slider portions include beds 208, each having a plurality of solder bumps 210. The carrier wafer includes a plurality of openings 212 that allow for the passage of hydrogen radicals from a hydrogen radical source 214. Each of the laser diodes also includes a plurality of solder bumps 216. When the two wafers are separated as shown in FIG. 13, the hydrogen radicals perform a cleaning function to clean the solder bumps. Hydrogen radicals can be formed using a process such as an atmospheric plasma. Alternatively, an active gas (such as formic acid) may be used to create preferential surface conditions on the solder surface.

Figure 14:
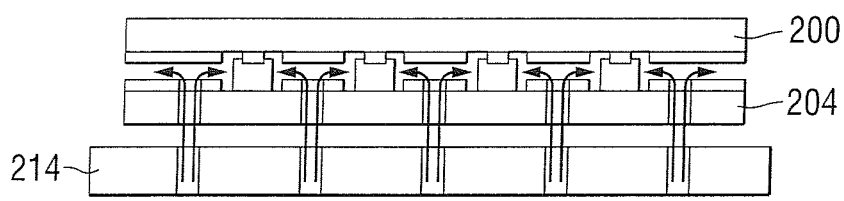
FIG. 14 is a cross-sectional view of a first wafer including a plurality of laser diodes and second wafer including a plurality of sliders.

FIG. 14 shows the structure of FIG. 13, wherein the second wafer has been moved toward the first wafer such that the solder bumps in the beds and on the diodes merge. In the step illustrated in FIG. 14, surface tension forces are used to urge the laser diodes toward stops that define the eventual relative position of the laser diode output facet and the waveguide input facet.

Figure 15:
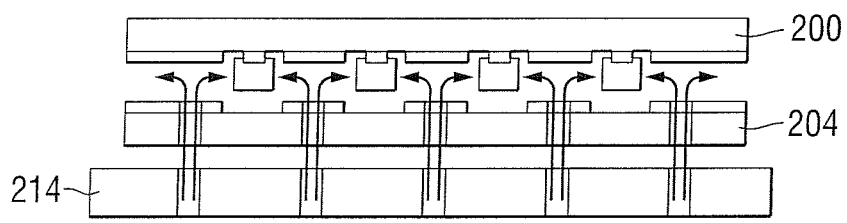
FIG. 15 is a cross-sectional view of a first wafer including a plurality of laser diodes and second wafer including a plurality of sliders.

FIG. 15 shows the structure of FIG. 14, wherein the carrier wafer has been moved away from the first wafer, leaving the laser diodes attached to the first wafer.

In one embodiment, an AlTiC head wafer is fabricated with waveguide elements and etched beds (or pockets) to receive the laser diodes. These pockets may include features for passive alignment, such as mechanical stops and/or solder bumps. The etched pockets define the eventual position of laser diode chips. The carrier wafer includes holes to allow the flow of chemically active substances such as hydrogen radicals and/or formic acid vapor. The size of the etched pockets should match the placing accuracy of a fast speed pick-and-place tool. The pocket position matches the position of slider portions in the head wafer. The size of the carrier wafer could be the same or bigger than the head wafer.

The laser diodes can be placed into the pockets on the carrier wafer with the fast speed pick-and-place tool. The laser diodes initially lie in pockets on the carrier wafer without mechanical attachment. Possible laser chip movements caused by vibration or incorrect horizontal orientation are limited by the carrier wafer pockets walls. Free movement of laser chips could be used to reduce placement tool position variation by using the pocket walls as mechanical stoppers.

The source of a chemically active substance can have a size matching the carrier wafer. An example of this source is a commercially available atmospheric plasma tool.

Figure 17:
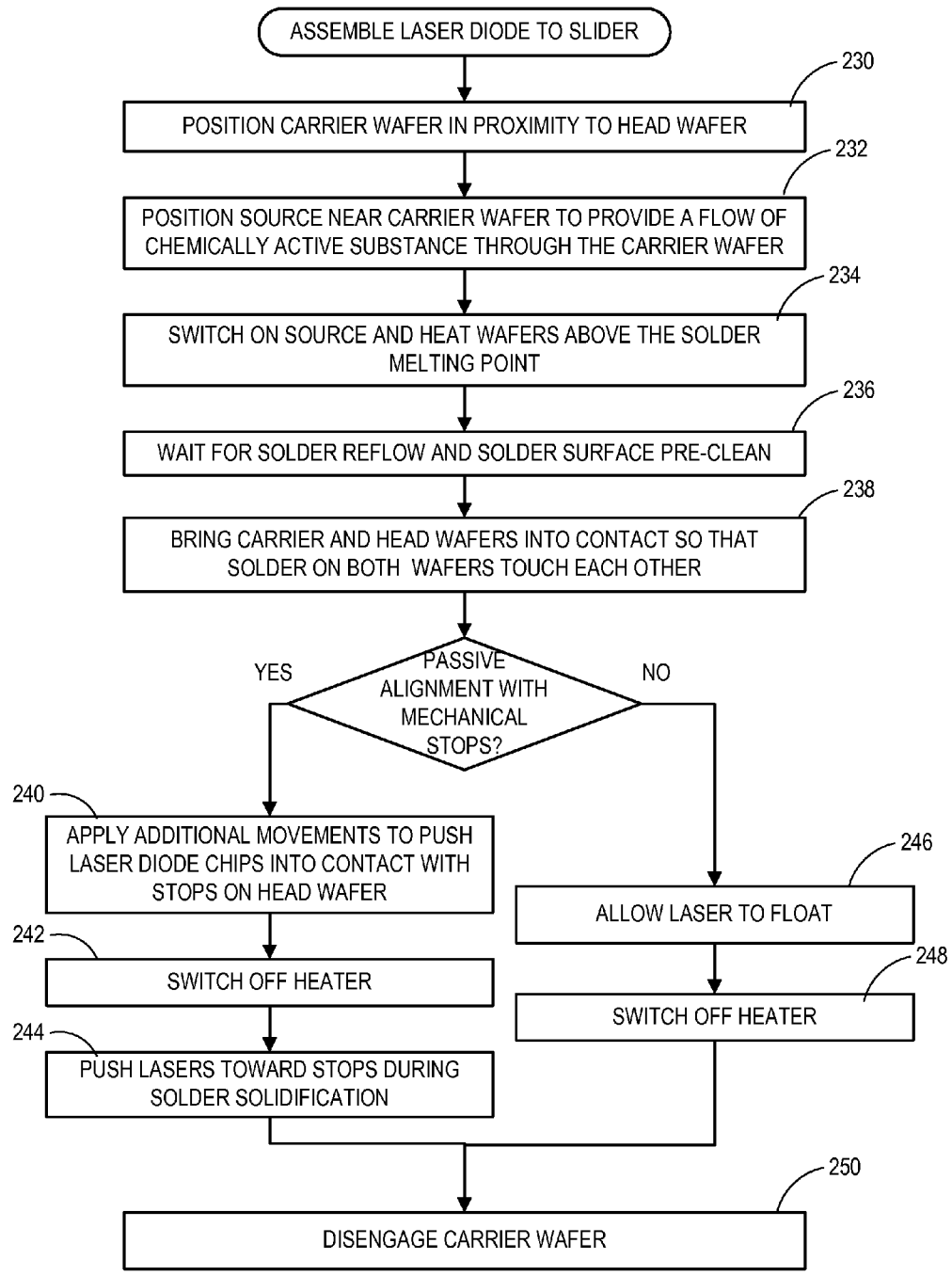
FIG. 17 is a flowchart illustrating assembly of a laser diode to a slider according to an example embodiment.

The process of assembling the laser diodes and the sliders, as illustrated in FIGS. 13-15, includes the steps shown in the flowchart of FIG. 17. First, the carrier wafer is positioned 230 into proximity of the head wafer, with a spacing, for example, of several millimeters (see FIG. 13). The source is positioned 232 near the carrier wafer to provide a flow of chemically active substance through the holes in the carrier wafer. The source is switched on 234 and the wafers are heated above the solder melting point. Some time is allowed 236 for solder reflow and solder surface pre-clean to remove oxide from solder surface. The gap between the wafers should be chosen to allow access to the solder on both wafers by the cleaning substance at the same time.

Next, the wafers are brought into contact 238 so that solder on both wafers touch each other (see also FIG. 14). The cleaning process continues immediately before bonding until the small gap restricts access to the solder. In the case of passive alignment with mechanical stops, additional movements may be applied 240 to push laser diode chips into contact with stops on the head wafer, and switch off the heater 242. Continue to push 244 the lasers toward the stops during solder solidification. After solidification, the carrier wafer is disengaged 250 (see also FIG. 15). If using the solder bumps for self-alignment, the laser is allowed to float 246 and the heater is switched off 248. The lasers should be floating during solder solidification.

Figure 16:
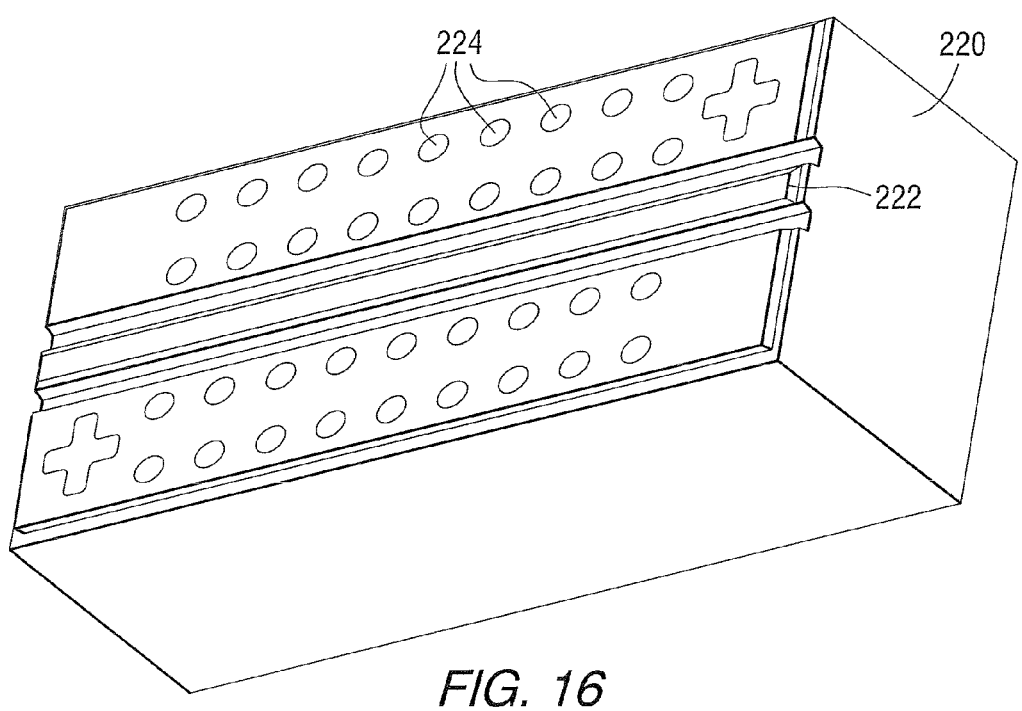
FIG. 16 is a perspective view of a laser diode according to an example embodiment.

The bond pad geometry and layout has a significant effect on the self-alignment properties of the laser diode. Primarily, the size, shape and volume of the solder array directly affect the alignment characteristics. A nominal layout is shown in FIG. 16, which shows an example of a self-alignment bond pad layout for an edge emitting laser diode 220 with a central heat-sink connection 222 and outer alignment pads 224. The pad layout includes a combination of solder self-alignment bumps and an elongated heat sink connection to provide solder self-alignment, electrical contact, and thermal cooling through the slider/head structure.

While several embodiments have been described, it will be apparent to those skilled in the art that various changes can be made to the described embodiments without departing from the scope of the claims. The implementations described above and other implementations are within the scope of the following claims.

What is claimed is:

1. A method comprising:
    positioning a carrier wafer relative to a head wafer such that each of a plurality of lasers of the carrier wafer is aligned with an alignment feature of a corresponding one of a plurality of slider portions of the head wafer;
    injecting a gas between the carrier wafer and the head wafer via openings in at least one the carrier wafer and the head wafer to create preferential surface conditions on solder surfaces therebetween; and
    performing a reflow operation to bond the lasers to the corresponding slider portions, wherein the reflow operation further causes a final alignment therebetween in cooperation with the alignment features of the slider portions.

2. The method of claim 1, wherein the alignment feature facilitates alignment between the lasers and channel waveguides of the corresponding slider portions.

3. The method of claim 2, wherein the alignment features comprise at least one of pockets on the slider portions and mechanical stops between output facets of the lasers and input facets of the channel waveguides, wherein the mechanical stops separates the input facets and output facets by a gap at least following the final alignment.

4. The method of claim 1, wherein the reflow operation further causes the final alignment in response to surface tension of solder bumps between the lasers and the slider portions.

5. The method of claim 4, further comprising disengaging the carrier wafer from the lasers during the reflow operation, thereby allowing the lasers to float during solder solidification following the reflow operation.

6. The method of claim 1, wherein positioning the carrier wave relative the head wafer comprises leaving a spacing between the lasers and slider portions, the method further comprising bringing the lasers into contact with the slider portions during the reflow operation.

7. The method of claim 1, wherein the gas comprises a hydrogen radical.

8. The method of claim 1, wherein the gas comprises a surface activating gas.

9. The method of claim 1, wherein each laser comprises an edge emitting laser diode.

10. The method of claim 1, further comprising, after the reflow operation, moving the carrier wafer from the head wafer, leaving the lasers attached to the first wafer.

11. The method of claim 1, further comprising, before positioning the carrier wafer relative to the head wafer, placing the lasers into pockets on the carrier wafer with a fast speed pick-and-place tool.

12. The method of claim 11, wherein the walls of the pockets limit movement of the lasers caused by vibration or incorrect orientation.

13. The method of claim 1, wherein each of the slider portions comprises a channel waveguide and a pocket having a wall and a bottom, the bottom of the pocket adjoined with and at an angle to the wall of the pocket, an input facet of the channel waveguide being disposed in a recess of the wall.

14. The method of claim 13, wherein positioning the carrier wafer relative to the head wafer comprises:
    positioning each laser at the bottom of each pocket outside of the recess such that an output facet of the laser directs light to the input facet in a lateral direction along the bottom of the pocket; and
    forcing each laser along the bottom of each pocket in the lateral direction until each laser abuts the wall of each pocket such that the recess in the wall of each pocket forms a gap between the output facet of each laser and the input facet of each channel waveguide in the lateral direction.

15. The method of claim 14, wherein forcing each laser toward the wall of each pocket comprises using surface tension forces of bonding material to push each laser toward the wall to align the output facet of the laser with the input facet of the channel waveguide.

16. The method of claim 15, wherein an intentional laser offset is used to allow lateral alignment to occur prior to contact with the wall.

17. The method of claim 15, wherein the relative alignment between laser pads and substrate pads is offset such that contact between the laser and the wall in an axial direction is reached prior to full alignment.

* * * * *